(12) United States Patent
Miyao et al.

(10) Patent No.: US 11,659,701 B2
(45) Date of Patent: May 23, 2023

(54) NOISE SUPPRESSION SHEET

(71) Applicant: TDK Corporation, Tokyo (JP)

(72) Inventors: Yosuke Miyao, Tokyo (JP); Toshio Tomonari, Tokyo (JP); Ryota Uchiyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/876,102

(22) Filed: Jul. 28, 2022

(65) Prior Publication Data

US 2023/0036443 A1 Feb. 2, 2023

(30) Foreign Application Priority Data

Jul. 29, 2021 (JP) .............................. JP2021-123881

(51) Int. Cl.
*H05K 9/00* (2006.01)
*H01Q 17/00* (2006.01)
*H01F 1/18* (2006.01)

(52) U.S. Cl.
CPC ............. *H05K 9/0088* (2013.01); *H01F 1/18* (2013.01); *H01Q 17/008* (2013.01); *H05K 9/0075* (2013.01)

(58) Field of Classification Search
CPC .......................... H05K 9/0088; H01Q 17/008
See application file for complete search history.

(56) References Cited

U.S. PATENT DOCUMENTS

| | | | | |
|---|---|---|---|---|
| 5,455,116 A * | 10/1995 | Nagano | ................ | H05K 9/0086 428/545 |
| 5,455,117 A * | 10/1995 | Nagano | ................ | H05K 9/0088 428/545 |
| 7,804,439 B2 * | 9/2010 | Yoshida | ............... | H01Q 17/002 342/4 |
| 7,864,095 B2 * | 1/2011 | Masuda | ................... | H01Q 1/38 342/1 |
| 8,164,506 B2 * | 4/2012 | Sim | ...................... | H01Q 17/008 342/4 |
| 2005/0016746 A1 * | 1/2005 | Sze | ...................... | H05K 1/0227 174/376 |
| 2010/0052992 A1 * | 3/2010 | Okamura | ............. | H01Q 19/108 343/700 MS |

FOREIGN PATENT DOCUMENTS

| | | |
|---|---|---|
| JP | 2003-243876 A | 8/2003 |
| JP | 2003-298278 A | 10/2003 |
| JP | 2005-184012 A | 7/2005 |
| JP | 2007-324217 A | 12/2007 |

* cited by examiner

*Primary Examiner* — Hung V Ngo
(74) *Attorney, Agent, or Firm* — McDermott Will & Emery LLP

(57) ABSTRACT

Disclosed herein is a noise suppression sheet that includes a magnetic sheet and a first metal layer provided on one surface of the magnetic sheet. The first metal layer has a plurality of annular slits. The first metal layer is divided into a plurality of first areas surrounded respectively by the plurality of slits and a second area surrounding an entire periphery of each of the plurality of slits.

9 Claims, 6 Drawing Sheets

NOISE SUPPRESSION SHEET

CROSS-REFERENCE TO RELATED APPLICATION

This application claims the benefit of Japanese Patent Application No. 2021-123881, filed on Jul. 29, 2021, the entire disclosure of which is incorporated by reference herein.

BACKGROUND

The present disclosure relates to a noise suppression sheet.

JP 2005-184012A discloses a noise suppression sheet having a structure in which an electromagnetic wave absorption layer and a pattern layer having a predetermined pattern shape are stacked.

SUMMARY

A noise suppression sheet according to one embodiment of the present disclosure includes a magnetic sheet and a first metal layer provided on one surface of the magnetic sheet and having a plurality of annular slits. The first metal layer is divided into a plurality of first areas surrounded respectively by the plurality of slits and a second area surrounding the entire periphery of each of the plurality of slits.

BRIEF DESCRIPTION OF THE DRAWINGS

The above features and advantages of the present disclosure will be more apparent from the following description of certain preferred embodiments taken in conjunction with the accompanying drawings, in which.

DETAILED DESCRIPTION OF THE EMBODIMENTS

An object of the present disclosure is to provide a noise suppression sheet having a higher noise suppression effect.

Preferred embodiments of the present disclosure will be explained below in detail with reference to the accompanying drawings.

Figure 1:
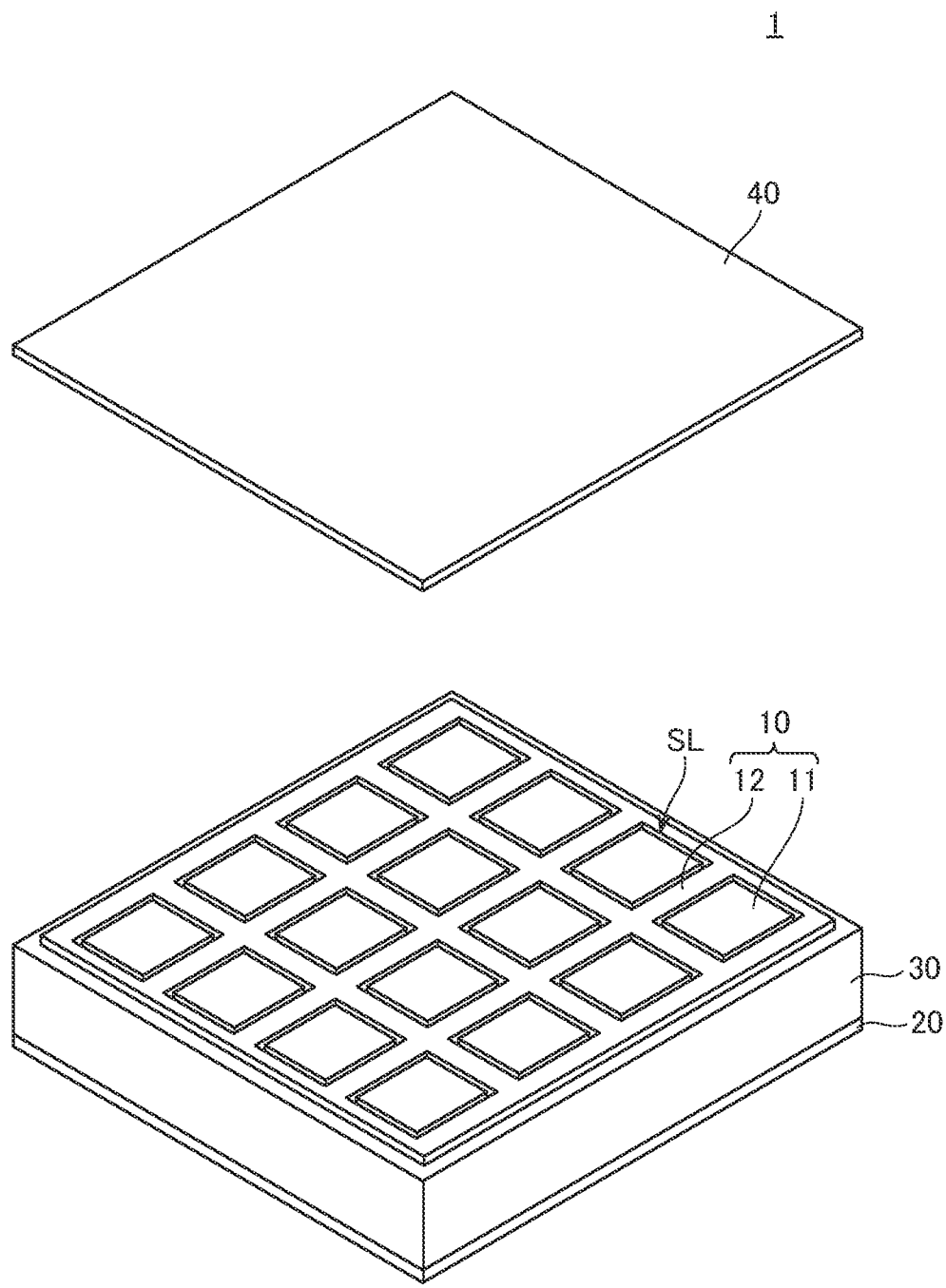
FIG. 1 is a schematic exploded perspective view illustrating the outer appearance of a noise suppression sheet 1 according to an embodiment of the present disclosure.
Figure 2A:
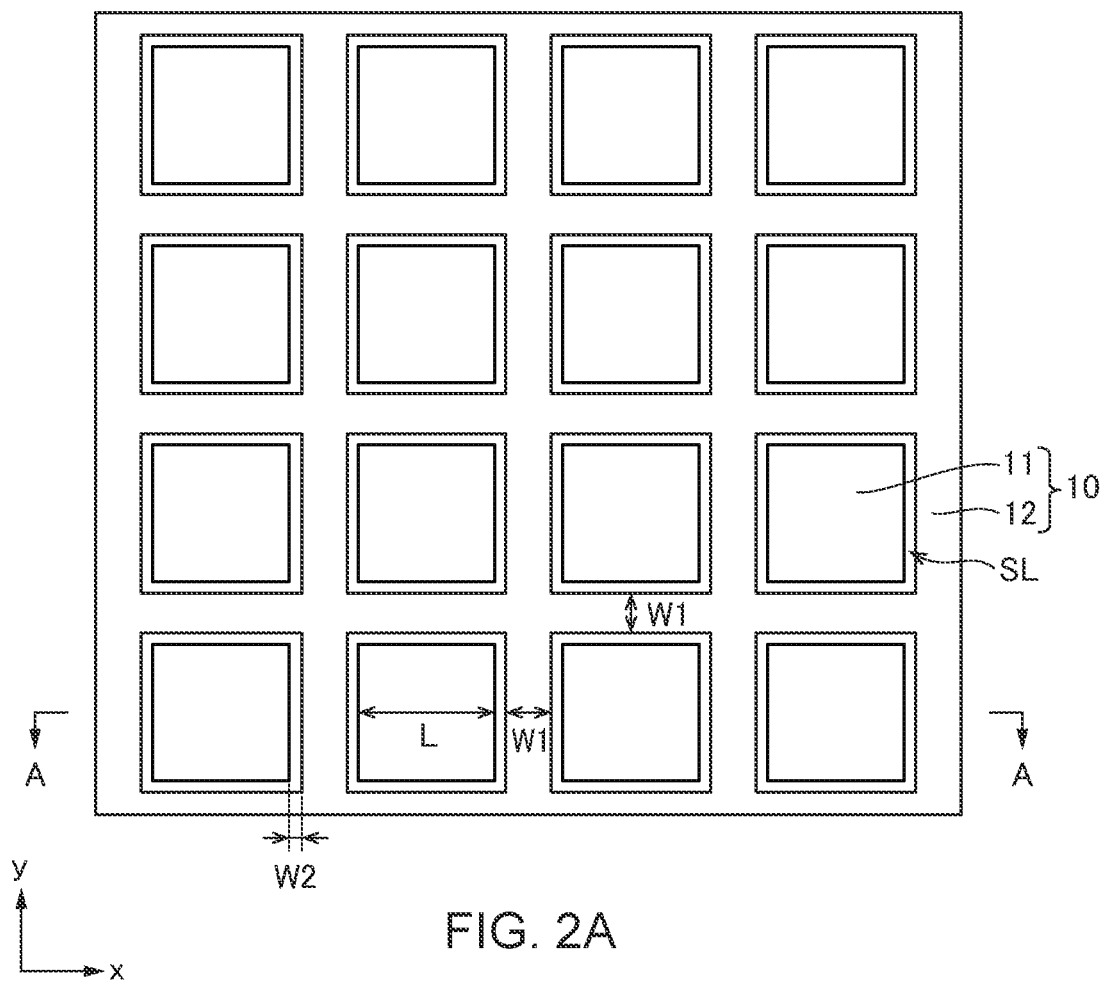
FIG. 2A is a schematic transparent plan view of the noise suppression sheet 1.

FIG. 1 is a schematic exploded perspective view illustrating the outer appearance of a noise suppression sheet 1 according to an embodiment of the present disclosure. FIG. 2A is a schematic transparent plan view of the noise suppression sheet 1, and FIG. 2B is a schematic cross-sectional view taken along the line A-A in FIG. 2A.

Figure 2B:
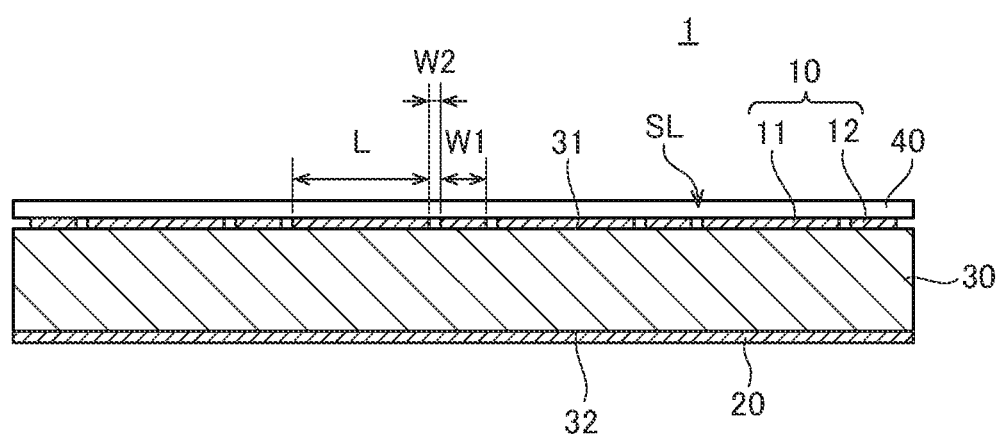
FIG. 2B is a schematic cross-sectional view taken along the line A-A in FIG. 2A.

The noise suppression sheet 1 according to the present embodiment is a sheet member for absorbing electromagnetic noise in a millimeter wave band and includes, as illustrated in FIG. 1 and FIGS. 2A and 2B, a film-like substrate 40, a first metal layer 10 provided on the surface of the film-like substrate 40, a second metal layer 20, and a magnetic sheet 30 positioned between the first and second metal layers 10 and 20.

The film-like substrate 40 is a film made of an insulating resin material such as PET. The thickness of the film-like substrate 40 is not particularly limited and can be set to about 2 μm. The magnetic sheet 30 is a sheet made of a material having a high permeability and may be a bulk body of ferrite or a metal magnetic material, or may be a composite magnetic material obtained by mixing a resin material and ferrite powder or metal magnetic powder. When the bulk body is used as the magnetic sheet 30, it may be divided into a plurality of magnetic pieces. By thus dividing the bulk body into a plurality of magnetic pieces to reduce conductivity, it is possible to suppress reflection of electromagnetic wave incident on the magnetic sheet 30 to thereby improve absorption characteristics. Further, by thus using the bulk body divided into a plurality of magnetic pieces or composite magnetic material, flexibility can be given to the noise suppression sheet 1. The thickness of the magnetic sheet 30 is not particularly limited and can be set to about 100 μm to 300 μm.

The first metal layer 10 is positioned between the film-like substrate 40 and the magnetic sheet 30 so as to cover one surface 31 of the magnetic sheet 30. The first metal layer 10 and magnetic sheet 30 may be bonded to each other by an adhesive or the like. The first metal layer 10 has a plurality of quadrangular annular slits SL by which the first metal layer 10 is divided into a plurality of first areas 11 surrounded respectively by the slits SL and a second area 12 surrounding the entire periphery of each of the slits SL. The pattern shape of the first area 11 is, for example, a square, and the plurality of first areas 11 are arranged in an array. The pattern shape of the first area 11 may not necessarily be a square; however, when the pattern shape of the first area 11 is a square, the arrangement pitch of the first area 11 in the x-direction and the arrangement pitch thereof in the y-direction can be made to coincide with each other. The slit SL continuously surrounds each first area 11, whereby the first and second areas 11 and 12 are electrically isolated from each other by the slit SL. The second area 12 is positioned outside the quadrangular annular slit SL and surrounds the entire periphery of the slit SL. The second area 12 is not constituted by a plurality of electrically isolated portions but is a single latticed metal layer. A production method for the first metal layer 10 is not particularly limited. For example, the first metal layer 10 may be produced by forming the slits SL, by etching, in a copper foil formed over the entire surface of the film-like substrate 40 or by forming, on the film-like substrate 40, a copper pattern corresponding to the first area 11 and a copper pattern corresponding to the second area 12 with a space corresponding to the slit SL provided therebetween.

The second metal layer 20 is provided so as to cover the other surface 32 of the magnetic sheet 30. The second metal layer 20 and the magnetic sheet 30 may be bonded to each other by an adhesive or the like. The noise suppression sheet 1 according to the present disclosure may not necessarily include the second metal layer 20; however, the presence of the second metal layer 20 can significantly improve electromagnetic wave absorption characteristics. The first and second metal layers 10 and 20 are not particularly limited in thickness and may have a thickness of about 1 μm. The first and second metal layers 10 and 20 may be the same or different in thickness. In order to provide sufficient flexibility, the first and second metal layers 10 and 20 may have a smaller thickness than the magnetic sheet 30.

The noise suppression sheet 1 according to the present embodiment functions to absorb electromagnetic wave in a millimeter wave band incident thereon from the film-like substrate 40 side. Specifically, electromagnetic wave incident on the magnetic sheet 30 through the slits SL attenuates when propagating in the magnetic sheet 30 while being repeatedly reflected by the first and second metal layers 10 and 20. In the noise suppression sheet 1 according to the present embodiment, the slit SL provided in the first metal layer 10 has a quadrangular annular shape, and the second area 12 positioned outside the slit SL is constituted by a single latticed metal layer, so that it is possible to sufficiently attenuate the electromagnetic wave entering the magnetic sheet 30.

Figure 3:
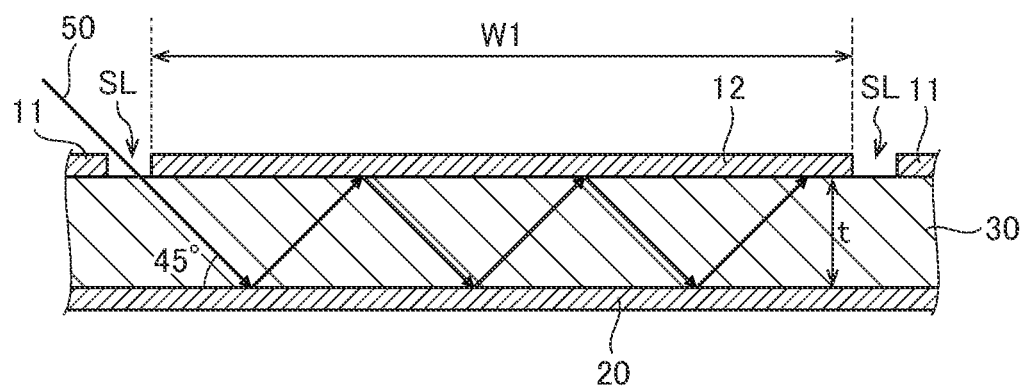
FIG. 3 is a schematic diagram for explaining how to propagate an electromagnetic wave 50 in the magnetic sheet 30.

Specifically, as illustrated in FIG. 3, an electromagnetic wave 50 obliquely incident on the magnetic sheet 30 through the slits SL makes three round trips in the magnetic sheet 30 to sufficiently attenuate. For example, the frequency of electromagnetic wave whose noise is to be suppressed is about 28 GHz, an attenuation amount of −2.6 dB can be obtained by one round trip in the magnetic sheet 30. Therefore, in order to obtain an attenuation amount of −6 dB (½ in terms of electric power), the electromagnetic wave may be made to make three or more round trips in the magnetic sheet 30. Assuming that the shallowest incident angle is 45°, a planar distance corresponding to the three round trips is six times a thickness t of the magnetic sheet 30. Accordingly, the minimum interval between the slits SL, i.e., a pattern width W1 of the second area 12 may be six or more times the thickness t of the magnetic sheet 30. This makes it possible to obtain a high attenuation effect on electromagnetic wave obliquely incident on the noise suppression sheet. Further, assuming that the pattern width of the second area 12 is W1, the thickness of the magnetic sheet 30 is t, and the width of the slit SL is W2, $W1 \geq t \times 6 + W2$ may be satisfied. This makes it possible to obtain sufficient attenuation effect of electromagnetic wave obliquely incident on the noise suppression sheet. The pattern width W1 of the second area 12 is defined by the width in the x-direction at a portion between the first areas 11 adjacent in the x-direction and is defined by the width in the y-direction at a portion between the first areas 11 adjacent in the y-direction. The thickness t of the magnetic sheet 30 is set to 300 μm or less when the frequency of electromagnetic wave whose noise is to be suppressed is about 28 GHz, whereby a high attenuation amount can be achieved.

A length L of one side of the first area 11, i.e., the pattern size of the first area 11 in the x- or y-direction may be ¼ or less of the wavelength of electromagnetic wave whose noise is to be suppressed. This sufficiently ensures the number of slits SL, making it possible to obtain a higher noise suppression effect. For example, when the frequency of electromagnetic wave whose noise is to be suppressed is about 28 GHz, the wavelength is about 10 mm, so that it is preferable to set the length of one side of the first area 11 to 2.5 mm or less. However, the length L of one side of the first area 11 may be larger than the pattern width W1 of the second area 12.

Figure 4A:
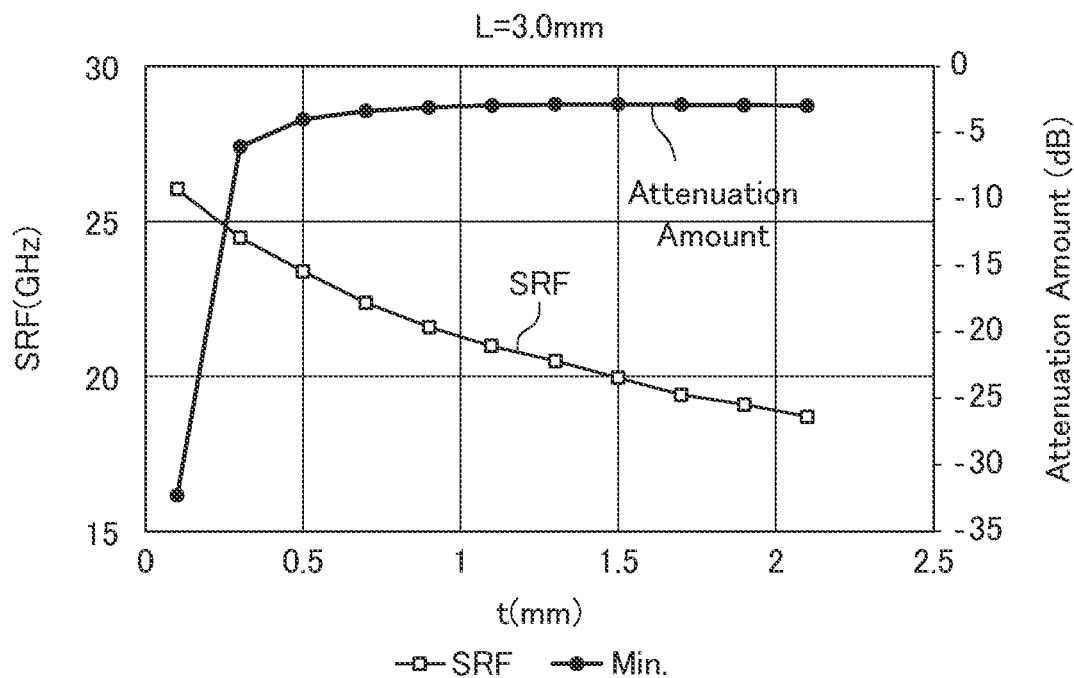
FIGS. 4A and 4B are graphs illustrating the relation between the thickness t of the magnetic sheet 30, attenuation amount, and self-resonance frequency (SRF)
Figure 4B:
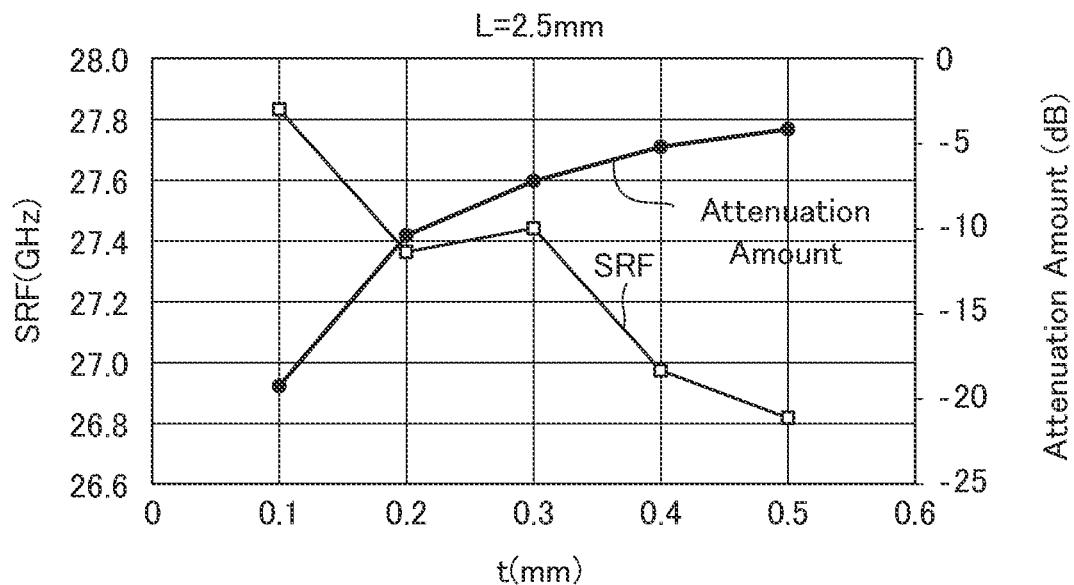

FIGS. 4A and 4B are graphs illustrating the relation between the thickness t of the magnetic sheet 30, attenuation amount, and self-resonance frequency (SRF). FIG. 4A illustrates a case where the length L of one side of the first area 11 is 3.0 mm, and FIG. 4B illustrates a case where the length L of one side of the first area 11 is 2.5 mm. As illustrated in FIGS. 4A and 4B, there is a strong correlation between the thickness t of the magnetic sheet 30 and the attenuation amount: when the thickness t becomes 300 μm or less, the attenuation amount abruptly increases to −6 dB (½ in terms of electric power). Further, the self-resonance frequency at which the largest attenuation amount can be obtained becomes higher as the thickness t of the magnetic sheet 30 is smaller and, in order to set the self-resonance frequency to about 28 GHz, the thickness t of the magnetic sheet 30 may be set to about 100 μm to 300 μm.

Figure 5A:
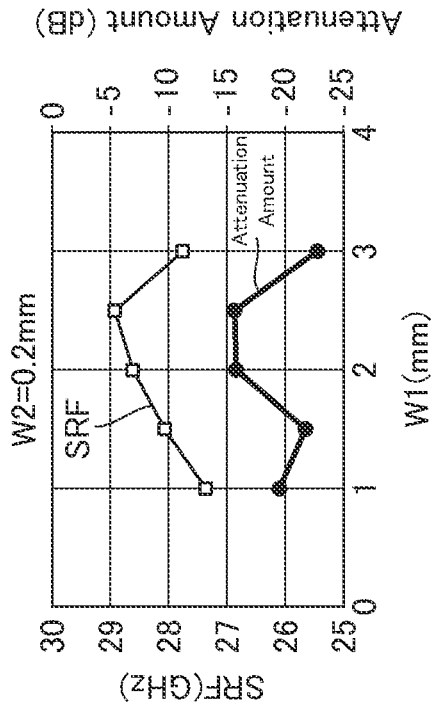
FIGS. 5A to 5D are graphs illustrating the relation between the pattern width W1 of the second area 12, attenuation amount, and self-resonance frequency (SRF)
Figure 5B:
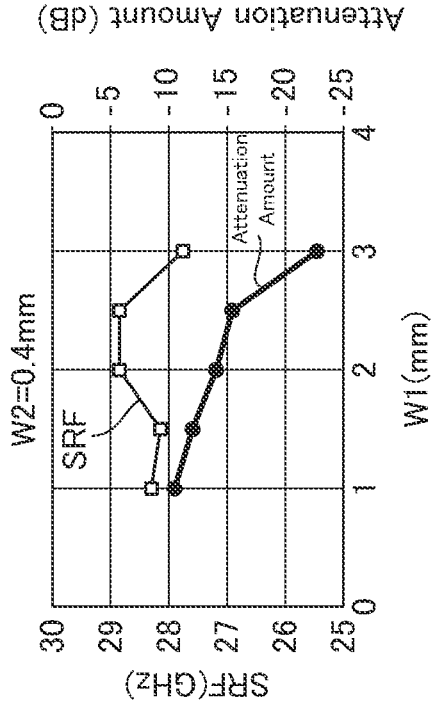
Figure 5C:
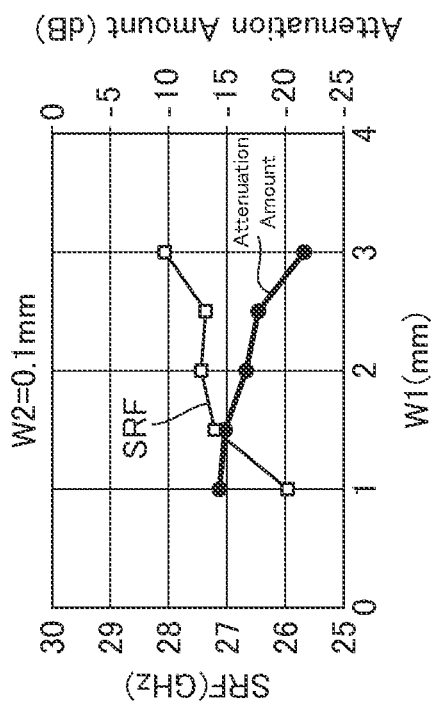
Figure 5D:
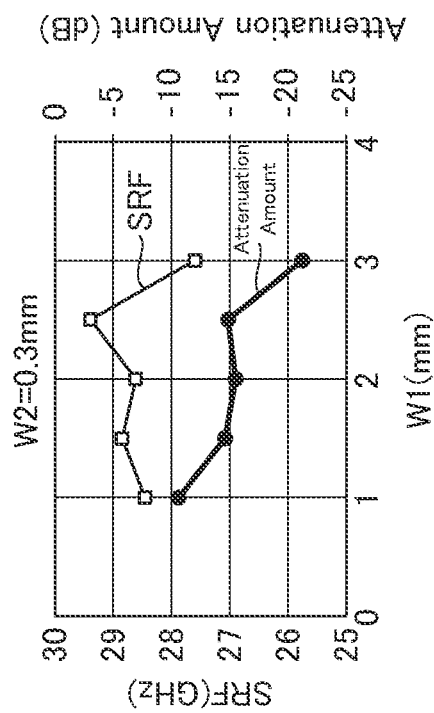

FIGS. 5A to 5D are graphs illustrating the relation between the pattern width W1 of the second area 12, attenuation amount, and self-resonance frequency (SRF). FIG. 5A illustrates a case where the width W2 of the slit SL is 0.1 mm, FIG. 5B illustrates a case where the width W2 of the slit SL is 0.2 mm, FIG. 5C illustrates a case where the width W2 of the slit SL is 0.3 mm, and FIG. 5D illustrates a case where the width W2 of the slit SL is 0.4 mm. As illustrated in FIGS. 5A to 5D, the attenuation amount tends to generally increase as the pattern width W1 of the second area 12 increases. The self-resonance frequency slightly varies depending on the pattern width W1 of the second area 12.

Figure 6A:
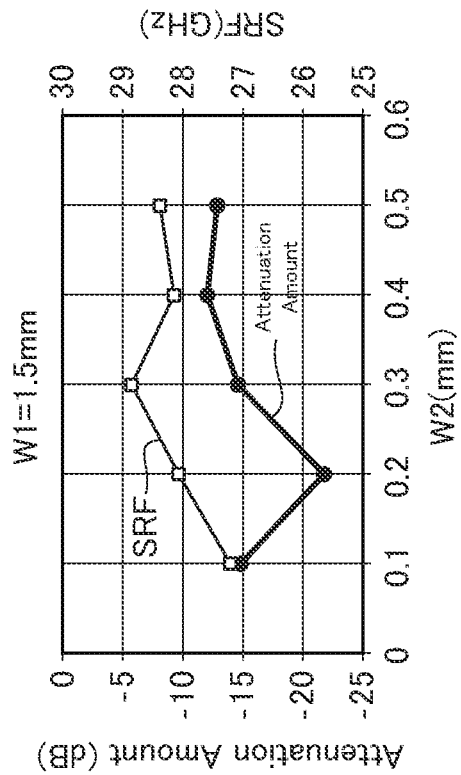
FIGS. 6A to 6D are graphs illustrating the relation between the width W2 of the slit SL, attenuation amount, and self-resonance frequency (SRF).
Figure 6B:
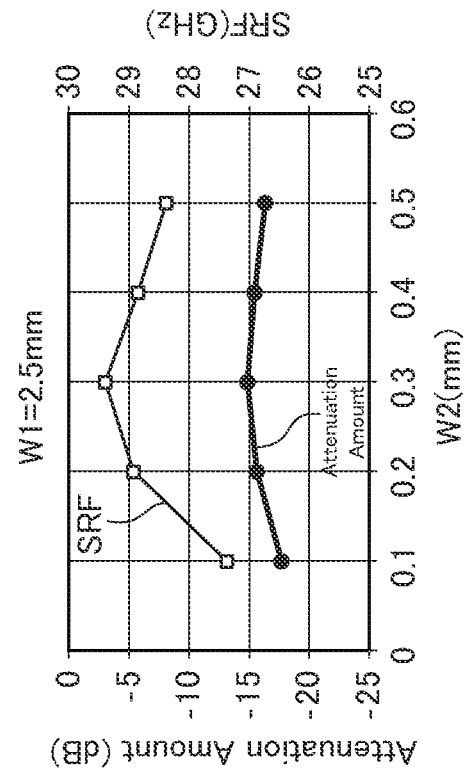
Figure 6C:
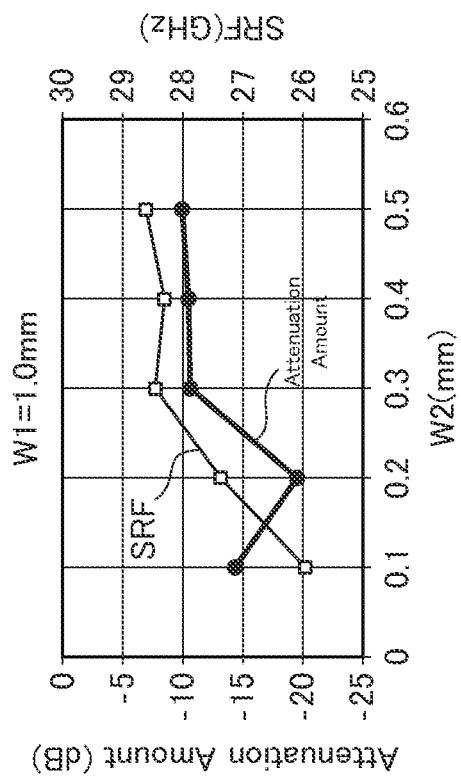
Figure 6D:
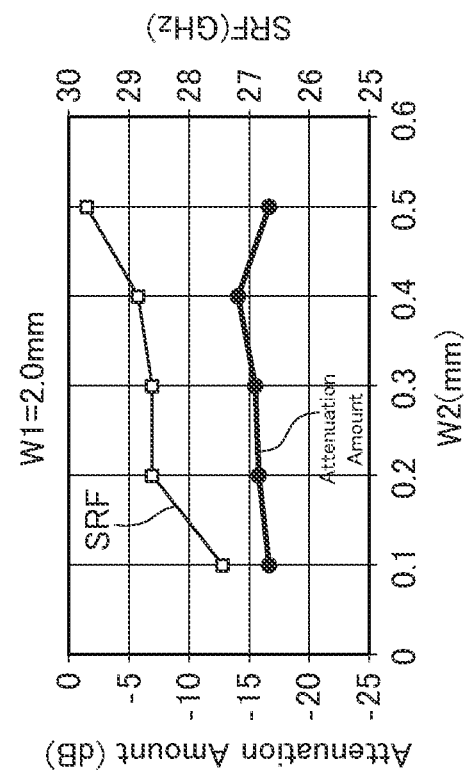

FIGS. 6A to 6D are graphs illustrating the relation between the width W2 of the slit SL, attenuation amount, and self-resonance frequency (SRF). FIG. 6A illustrates a case where the pattern width W1 of the second area 12 is 1.0 mm, FIG. 6B illustrates a case where the pattern width W1 of the second area 12 is 1.5 mm, FIG. 6C illustrates a case where the pattern width W1 of the second area 12 is 2.0 mm, and FIG. 6D illustrates a case where the pattern width W1 of the second area 12 is 2.5 mm. As illustrated in FIGS. 6A to 6D, although there is no strong correlation between the width W2 of the slit SL and the attenuation amount, the self-resonance frequency varies to some extent depending on the width W2 of the slit SL.

By utilizing the above characteristics, it is possible to adjust the attenuation amount mainly by the pattern width W1 of the second area 12 and to adjust the self-resonance frequency mainly by the width W2 of the slit SL.

As described above, in the noise suppression sheet 1 according to the present embodiment, the first metal layer 10 is divided into the plurality of first areas 11 and the second area 12 by the slits SL, thereby allowing electromagnetic wave incident on the magnetic sheet 30 through the slits SL, particularly, electromagnetic wave in a millimeter wave band to be effectively attenuated. In addition, the second area 12 is not divided but constituted by a single metal layer, allowing electromagnetic wave incident on the magnetic sheet 30 to be effectively confined therein, which makes it possible to obtain a large attenuation amount.

While the preferred embodiment of the present disclosure has been described, the present disclosure is not limited to the above embodiment, and various modifications may be made within the scope of the present disclosure, and all such modifications are included in the present disclosure.

For example, in the above embodiment, the slit SL formed in the first metal layer 10 has a quadrangular annular shape; however, the slit SL may not necessarily have a quadrangular annular shape and may have an annular shape other than the quadrangular annular shape, such as a circular annular shape, an elliptical annular shape, a polygonal annular shape, as long as it electrically isolates the first and second areas 11 and 12.

The technology according to the present disclosure includes the following configuration examples but not limited thereto.

A noise suppression sheet according to the present disclosure includes a magnetic sheet and a first metal layer provided on one surface of the magnetic sheet and having a plurality of annular slits. The first metal layer is divided into a plurality of first areas surrounded respectively by the plurality of slits and a second area surrounding the entire periphery of each of the plurality of slits. With this configuration, there can be provided a noise suppression sheet having a higher noise suppression effect.

The noise suppression sheet according to the present disclosure may further include a second metal layer provided on the other surface of the magnetic sheet. With this configuration, electromagnetic wave incident on the magnetic sheet through the slits propagates in the magnetic sheet while being repeatedly reflected by the first and second metal layers, thereby significantly improving electromagnetic wave absorption characteristics.

The pattern width of the second area of the first metal layer may be six or more times the thickness of the magnetic sheet. This allows electromagnetic wave obliquely incident at an angle of 45° on the magnetic sheet through the slits to make three round trips in the magnetic sheet.

The first and second metal layers may each have a thickness less than the thickness of the magnetic sheet. This can provide sufficient flexibility.

The pattern shape of the first area of the first metal layer may be a square. This allows the arrangement pitch of the first area in the x-direction and the arrangement pitch thereof in the y-direction to coincide with each other.

The thickness of the magnetic sheet may be 300 μm or less. This allows electromagnetic wave noise in a millimeter wave band to be effectively absorbed.

The magnetic sheet may include a plurality of divided magnetic pieces. This can make the noise suppression sheet flexible.

The noise suppression sheet according to the present disclosure may further include a film-like substrate on which the first metal layer is provided, and the first metal layer may be positioned between the film-like substrate and the magnetic sheet. This can facilitate processing of the first metal layer and prevent exposure of the first metal layer.

The length of one side of the first area may be ¼ or less of the wavelength of electromagnetic wave whose noise is to be suppressed. This ensures a sufficient number of slits SL, making it possible to obtain a higher noise suppression effect.

What is claimed is:

1. A noise suppression sheet comprising:
a magnetic sheet; and
a first metal layer provided on one surface of the magnetic sheet,
wherein the first metal layer has a plurality of annular slits, and
wherein the first metal layer is divided into a plurality of first areas surrounded respectively by the plurality of slits and a second area surrounding an entire periphery of each of the plurality of slits.

2. The noise suppression sheet as claimed in claim 1, further comprising a second metal layer provided on other surface of the magnetic sheet.

3. The noise suppression sheet as claimed in claim 2, wherein a pattern width of the second area of the first metal layer is six or more times a thickness of the magnetic sheet.

4. The noise suppression sheet as claimed in claim 2, wherein each of the first and second metal layers has a thickness less than a thickness of the magnetic sheet.

5. The noise suppression sheet as claimed in claim 1, wherein a pattern shape of the first area of the first metal layer is a square.

6. The noise suppression sheet as claimed in claim 1, wherein a thickness of the magnetic sheet is 300 μm or less.

7. The noise suppression sheet as claimed in claim 1, wherein the magnetic sheet includes a plurality of divided magnetic pieces.

8. The noise suppression sheet as claimed in claim 1, further comprising a film-like substrate on which the first metal layer is provided,
wherein the first metal layer is positioned between the film-like substrate and the magnetic sheet.

9. The noise suppression sheet as claimed in claim 1, wherein a length of one side of the first area is ¼ or less of a wavelength of electromagnetic wave whose noise is to be suppressed.

* * * * *